United States Patent
Li

(10) Patent No.: US 11,302,876 B2
(45) Date of Patent: Apr. 12, 2022

(54) ORGANIC LIGHT EMITTING DIODE DISPLAY PANEL AND METHOD OF MANUFACTURING SAME

(71) Applicant: WUHAN CHINA STAR OPTOELECTRONICS SEMICONDUCTOR DISPLAY TECHNOLOGY CO., LTD., Wuhan (CN)

(72) Inventor: Zhao Li, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 689 days.

(21) Appl. No.: 16/316,868

(22) PCT Filed: Dec. 20, 2018

(86) PCT No.: PCT/CN2018/122232
§ 371 (c)(1),
(2) Date: Jan. 10, 2019

(87) PCT Pub. No.: WO2020/077799
PCT Pub. Date: Apr. 23, 2020

(65) Prior Publication Data
US 2021/0351366 A1   Nov. 11, 2021

(30) Foreign Application Priority Data

Oct. 17, 2018   (CN) .......................... 201811208209.1

(51) Int. Cl.
*H01L 51/00*   (2006.01)
*H01L 27/32*   (2006.01)
(Continued)

(52) U.S. Cl.
CPC ...... *H01L 51/0097* (2013.01); *H01L 27/3244* (2013.01); *H01L 51/003* (2013.01);
(Continued)

(58) Field of Classification Search
None
See application file for complete search history.

(56) References Cited

U.S. PATENT DOCUMENTS 10,930,869 B2 *   2/2021   Dong ................ B32B 17/10899
2013/0075739 A1 *   3/2013   Loy ..................... H01L 21/6835
257/60

(Continued)

FOREIGN PATENT DOCUMENTS

| CN | 105789257 A | 7/2016 |
| CN | 107994129 A | 5/2018 |
| KR | 20150078392 A | 7/2015 |

Primary Examiner — J. E. Schoenholtz
(74) Attorney, Agent, or Firm — Osha Bergman Watanabe & Burton LLP

(57) ABSTRACT

An organic light emitting diode (OLED) display panel and a method of manufacturing same are provided. The method includes forming a wetting layer on a substrate, such that a hydrophilicity of a surface of the substrate is same as a hydrophilicity of a flexible material layer to be formed, forming the flexible material layer on the wetting layer, wherein the formed flexible material layer has a same film thickness at different positions, and sequentially forming a thin film transistor layer and an organic light emitting layer on the flexible material layer.

15 Claims, 1 Drawing Sheet

S10 — Providing a substrate, forming a wetting layer on the substrate, such that a hydrophilicity of a surface of the substrate is same as a hydrophilicity of a flexible material layer to be formed S20 — Forming the flexible material layer on the wetting layer, wherein the formed flexible material layer has a same film thickness at different positions S30 — Sequentially forming a thin film transistor layer and an organic light emitting layer on the flexible material layer

(51) Int. Cl.
H01L 51/52 (2006.01)
H01L 51/56 (2006.01)

(52) U.S. Cl.
CPC .......... H01L 51/5253 (2013.01); H01L 51/56 (2013.01); *H01L 2227/326* (2013.01); *H01L 2251/5338* (2013.01)

(56) References Cited

U.S. PATENT DOCUMENTS

| | | |
|---|---|---|
| 2017/0279080 A1 | 9/2017 | Wang et al. |
| 2019/0198584 A1 | 6/2019 | Chen |
| 2020/0045818 A1* | 2/2020 | Xu .................... H01L 51/003 |

* cited by examiner

ORGANIC LIGHT EMITTING DIODE DISPLAY PANEL AND METHOD OF MANUFACTURING SAME

FIELD OF INVENTION

The present disclosure relates to the field of display panel manufacturing technologies, and more particularly to an organic light emitting diode (OLED) display panel and a method of manufacturing same.

BACKGROUND OF INVENTION

A flexible organic light emitting diode (OLED) display panel device includes a polyimide (PI) flexible layer, a thin film field effect transistor driving layer, an OLED light emitting layer, and a thin film encapsulation (TFE) layer, etc. from bottom to top. In flexible OLED display technologies, PI is often used in place of a conventional glass substrate to achieve folding and flexible display. Most industry methods of manufacturing a PI substrate are coating methods, that is, coating PI solution with a certain thickness on a glass substrate, and solvent is volatilized to form a PI hard film. Due to factors such as the PI solution and the glass substrate, it is difficult for the PI solution to spread on the glass substrate. In particular, an edge region of the glass substrate is easy to form island effusion, and this causes uneven film thickness of the PI substrate, which affects a product yield and a resistance of the OLED display panel.

Therefore, the prior art has drawbacks and these issues are in urgent need for improvement.

SUMMARY OF INVENTION

The present disclosure provides an organic light emitting diode (OLED) display panel and a method of manufacturing same, which can improve a thickness uniformity of a flexible material layer and improve a product yield and a resistance of the OLED display panel.

To achieve the above objective, a technical solution provided by the present disclosure is as follows:

An embodiment of the present disclosure provides a method of manufacturing an OLED display panel. The method includes:

a step S10 of providing a substrate, forming a wetting layer on the substrate, such that a hydrophilicity of a surface of the substrate is same as a hydrophilicity of a flexible material layer to be formed, a step S20 of forming the flexible material layer on the wetting layer, wherein the formed flexible material layer has a same film thickness at different positions, and a step S30 of sequentially forming a thin film transistor layer and an organic light emitting layer on the flexible material layer.

In an embodiment of the present disclosure, the step S10 includes:

a step S101 of using a glass substrate as the substrate, coating or spraying wetting layer material liquid configured to form the wetting layer on a surface of the glass substrate, wherein the wetting layer material liquid is hydrophobic, and a step S102 of heating and removing solvent of the wetting layer material liquid to form the wetting layer.

In an embodiment of the present disclosure, the wetting layer material liquid has a mass concentration of 0.01% to 10%.

In an embodiment of the present disclosure, the step S20 includes:

a step S201 of forming flexible material liquid configured to form the flexible material layer on the substrate on which the wetting layer is formed, and a step S202 of leveling and spreading the flexible material liquid on a surface of the wetting layer, heating and solidifying the flexible material liquid to form the flexible material layer having a same film thickness.

In an embodiment of the present disclosure, a material of the wetting layer includes amphiphilic surfactant including one or more of a quaternary ammonium salt, sodium laurylsulfonate, sodium dodecyl benzene sulfonate, polyvinyl alcohol, and polyvinyl chloride.

In an embodiment of the present disclosure, the method further includes:

a step S40 of forming a thin film encapsulation layer on the organic light emitting layer, a step S50 of forming a protective cover on the thin film encapsulation layer, and a step S60 of peeling off the substrate.

To achieve the above objective, an embodiment of the present disclosure further provides an OLED display panel. The OLED display panel includes a flexible material layer, a thin film transistor layer disposed on the flexible material layer, an organic light emitting layer disposed on the thin film transistor layer, and a wetting layer disposed on a side of the flexible material layer facing away from the organic light emitting layer. The flexible material layer has a same film thickness.

In an embodiment of the present disclosure, the wetting layer has a same film thickness.

In an embodiment of the present disclosure, a material of the wetting layer is hydrophobic.

In an embodiment of the present disclosure, a material of the wetting layer includes amphiphilic surfactant including one or more of a quaternary ammonium salt, sodium laurylsulfonate, sodium dodecyl benzene sulfonate, polyvinyl alcohol, and polyvinyl chloride.

To achieve the above objective, an embodiment of the present disclosure further provides an OLED display panel. The OLED display panel includes a flexible material layer, a thin film transistor layer disposed on the flexible material layer, an organic light emitting layer disposed on the thin film transistor layer, and a wetting layer disposed on a side of the flexible material layer facing away from the organic light emitting layer. A hydrophilicity of the wetting layer is same as a hydrophilicity of the flexible material layer, and the flexible material layer has a same film thickness.

In an embodiment of the present disclosure, the wetting layer has a same film thickness.

In an embodiment of the present disclosure, a material of the wetting layer is hydrophobic.

In an embodiment of the present disclosure, the wetting layer is made by wetting layer material liquid having a mass concentration of 0.01% to 10%.

In an embodiment of the present disclosure, a material of the wetting layer includes amphiphilic surfactant including one or more of a quaternary ammonium salt, sodium laurylsulfonate, sodium dodecyl benzene sulfonate, polyvinyl alcohol, and polyvinyl chloride.

Compared to a current method of manufacturing an OLED display panel, beneficial effects of an embodiment of the present disclosure are that, in an OLED display panel and a method of manufacturing same of the embodiment of the present disclosure, a wetting layer is first coated on a glass substrate, such that a hydrophilicity of a surface of the glass substrate is same as a hydrophilicity of a flexible material layer to be formed, flexible material liquid can be spread on the glass substrate after coating. After heating and solidifying the flexible material liquid, the flexible material layer is formed. A film thickness uniformity of the flexible material layer can be improved by using the technical solution, thereby improving a product yield and a resistance of the OLED display panel.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
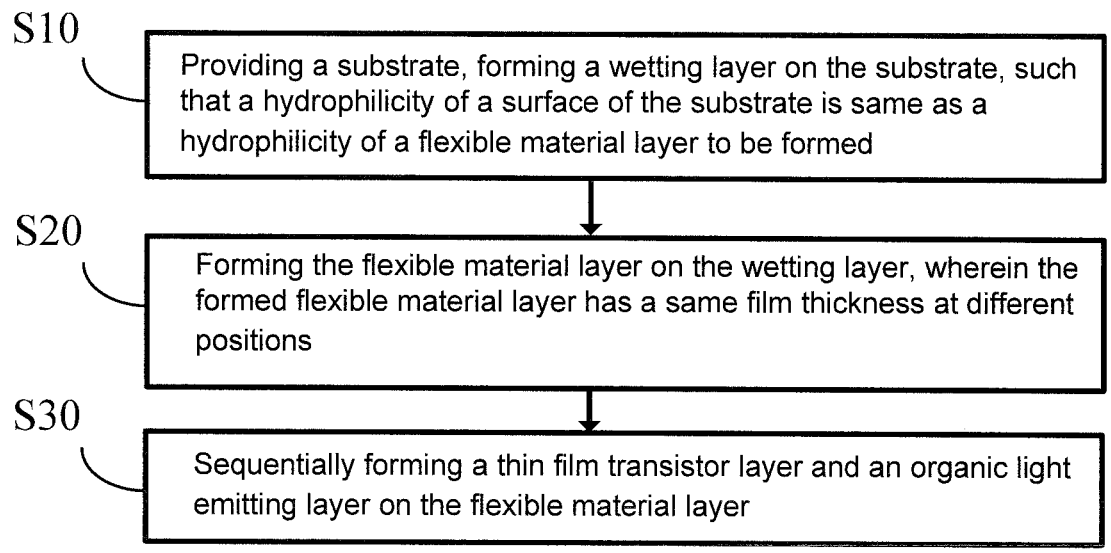
FIG. 1 is a flowchart of a method of manufacturing an organic light emitting diode (OLED) display panel according to an embodiment of the present disclosure.

The following description of the various embodiments is provided to illustrate the specific embodiments. Directional terms described by the present disclosure, such as top, bottom, front, back, left, right, inner, outer, side, etc., are only directions by referring to the accompanying drawings, and thus the used terms are used only for the purpose of describing embodiments of the present disclosure and are not intended to be limiting of the present disclosure. In the drawings, units with similar structures are labeled with the same reference number.

The embodiment of the present disclosure can solve defects of the prior art, in which an organic light emitting diode (OLED) display panel of the prior art, in a process of manufacturing a flexible material layer, a film thickness of the flexible material layer is easily uneven, thereby affecting technical problems of a product yield and a resistance of the OLED display panel.

Referring to FIG. 1, a flowchart of a method of manufacturing an organic light emitting diode (OLED) display panel according to an embodiment of the present disclosure is provided. In the embodiment of the present disclosure, the method includes the following steps:

Step S10 of providing a substrate, forming a wetting layer on the substrate, such that a hydrophilicity of a surface of the substrate is same as a hydrophilicity of a flexible material layer to be formed is provided.

In details, the step S10 includes the following steps.

Step S101 of using a glass substrate as the substrate, coating or spraying wetting layer material liquid configured to form the wetting layer on a surface of the glass substrate is provided.

Because the flexible material layer is generally made of a polyimide material and the polyimide material has a hydrophobicity difference from a hydrophilicity of the glass substrate. Therefore, the polyimide material coated on a surface of the glass substrate is difficult to level and spread. For this purpose, in the embodiment, before manufacturing the flexible material layer, wetting layer material liquid having hydrophobicity is formed in advance by coating or spraying on the surface of the glass substrate to change a hydrophilicity of a contact surface of the glass substrate with the flexible material layer.

Step S20 of forming the flexible material layer on the wetting layer is provided.

A material of the wetting layer includes amphiphilic surfactant including one or more of a quaternary ammonium salt, sodium laurylsulfonate, sodium dodecyl benzene sulfonate, polyvinyl alcohol, and polyvinyl chloride. The wetting layer material liquid includes a hydrophobic active group. After the wetting layer material liquid is formed on the glass substrate, molecules of the wetting layer liquid are arranged in such a manner that one end of the hydrophobic active group is away from the glass substrate. After the solvent is removed by heating, the wetting layer is formed, at which time the surface of the glass substrate for contact with the flexible material layer is changed from hydrophilic to hydrophobic.

Before coating the wetting layer material liquid, the wetting layer material liquid having a certain concentration is formed, a mass concentration of the wetting layer material liquid is 0.01% to 10%. Preferably, a mass concentration of the wetting layer material is 0.01% to 1%.

Step S20 of forming the flexible material layer on the wetting layer, wherein the formed flexible material layer has a same film thickness at different positions is provided.

In details, the step S20 includes the following steps:

Step S201 of forming flexible material liquid configured to form the flexible material layer on the substrate on which the wetting layer is formed, and Step S202 of leveling and spreading the flexible material liquid on a surface of the wetting layer, heating and solidifying the flexible material liquid to form the flexible material layer having a same film thickness.

The hydrophobic flexible material liquid is coated on the glass substrate on which the wetting layer is formed, and the flexible material liquid has a hydrophilicity same as a hydrophilicity of a contact surface of the glass substrate, such that the flexible material liquid can be naturally leveled on the glass substrate, and after curing the flexible material liquid, the flexible material layer having a same film thickness is formed.

A thickness of the flexible material layer ranges between 2 µm and 50 µm. Preferably, the thickness of the flexible material layer ranges between 10 µm and 20 µm.

Step S30 of sequentially forming a thin film transistor layer and an organic light emitting layer on the flexible material layer is provided.

The thin film transistor layer includes an active layer, a gate insulating layer, a gate electrode, an interlayer insulating layer, and a source and a drain, which are electrically connected to the active layer. There is no limit here.

The method also includes the following steps:

Step S40 of forming a thin film encapsulation layer on the organic light emitting layer, and Step S50 of forming a protective cover on the thin film encapsulation layer.

The organic light emitting layer, the thin film encapsulating layer, and the protective cover are made by a conventional method, and are not described herein again.

In addition, the method further includes the following steps:

Step S60 of peeling off the substrate is provided.

Finally, the substrate (glass substrate) attached to the surface of the flexible material layer is peeled off, and may be performed by a stripping liquid or a mechanical method to finally form the OLED display panel.

Figure 2:
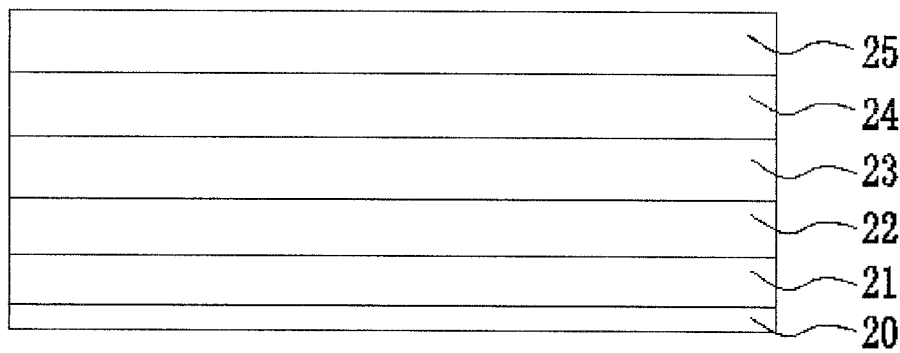
FIG. 2 is a schematic structural diagram of an OLED display panel according to an embodiment of the present disclosure.

An embodiment of the present disclosure further provides an OLED display panel formed by the above manufacturing method. As illustrated in FIG. 2, the OLED display panel includes a flexible material layer 21, a thin film transistor layer 22 disposed on the flexible material layer 21, an organic light emitting layer 23 disposed on the thin film transistor layer 22, a thin film encapsulation layer 24 disposed on the organic light emitting layer 23, and a protective cover 25 disposed on the thin film encapsulation layer 24. A wetting layer 20 is disposed on a side of the flexible material layer 21 facing away from the organic light emitting layer 23. A surface of the wetting layer 20 is flat, and a film thickness thereof remains uniform. A film thickness of the flexible material layer 21 at different positions also remains uniform.

Material of the wetting layer 20 is hydrophobic, and a surface amphiphilicity of the glass substrate (not shown in the drawings) for carrying the flexible material layer 21 during the manufacturing process of the OLED display panel can be changed, such that a solution forming the flexible material layer 21 is leveled and spread on the surface of the glass substrate. The glass substrate is peeled off in a subsequent process, and the wetting layer 20 remains on the surface of the flexible material layer 21, such that the film thickness of the formed flexible material layer 21 remains uniform.

In the embodiment, because the wetting layer 20 serves to improve the amphiphilicity of the surface of the glass substrate, the film thickness thereof can be thin and does not affect the OLED display panel.

In an embodiment, the material of the wetting layer 20 includes but is not limited to amphiphilic surfactant including one or more of a quaternary ammonium salt, sodium laurylsulfonate, sodium dodecyl benzene sulfonate, polyvinyl alcohol, and polyvinyl chloride.

It is understood that, the OLED display panel may further include other conventional film layers, such as a polarizer, which is not limited herein. For the manufacturing method of each film layer of the OLED display panel, refer to the description in the above method of the embodiment, and details are not described herein again.

In an OLED display panel and a method of manufacturing same of the embodiment of the present disclosure, a wetting layer is first coated on a glass substrate, such that a hydrophilicity of a surface of the glass substrate is same as a hydrophilicity of a flexible material layer to be formed, flexible material liquid can be spread on the glass substrate after coating. After heating and solidifying the flexible material liquid, the flexible material layer is formed. A film thickness uniformity of the flexible material layer can be improved by using the technical solution, thereby improving a product yield and a resistance of the OLED display panel.

In summary, although the preferable embodiments of the present disclosure have been disclosed above. It should be noted that those of ordinary skill in the art can make a variety of improvements and substitutions on the premise of not deviating from the technical principle of the present disclosure, and these improvements and substitutions should be encompassed within the protection scope of the present disclosure.

The invention claimed is:

1. A method of manufacturing an organic light emitting diode (OLED) display panel, comprising:
   a step S10 of providing a substrate, forming a wetting layer on the substrate, such that a hydrophilicity of a surface of the substrate is same as a hydrophilicity of a flexible material layer to be formed;
   a step S20 of forming the flexible material layer on the wetting layer, wherein the formed flexible material layer has a same film thickness at different positions; and
   a step S30 of sequentially forming a thin film transistor layer and an organic light emitting layer on the flexible material layer.

2. The method according to claim 1, wherein the step S10 comprises:
   a step S101 of using a glass substrate as the substrate, coating or spraying wetting layer material liquid configured to form the wetting layer on a surface of the glass substrate, wherein the wetting layer material liquid is hydrophobic; and
   a step S102 of heating and removing solvent of the wetting layer material liquid to form the wetting layer.

3. The method according to claim 2, wherein the wetting layer material liquid has a mass concentration of 0.01% to 10%.

4. The method according to claim 1, wherein the step S20 comprises:
   a step S201 of forming flexible material liquid configured to form the flexible material layer on the substrate on which the wetting layer is formed; and
   a step S202 of leveling and spreading the flexible material liquid on a surface of the wetting layer, heating and solidifying the flexible material liquid to form the flexible material layer having a same film thickness at different positions.

5. The method according to claim 1, wherein a material of the wetting layer comprises amphiphilic surfactant comprising one or more of a quaternary ammonium salt, sodium laurylsulfonate, sodium dodecyl benzene sulfonate, polyvinyl alcohol, and polyvinyl chloride.

6. The method according to claim 1, further comprising:
   a step S40 of forming a thin film encapsulation layer on the organic light emitting layer;
   a step S50 of forming a protective cover on the thin film encapsulation layer; and
   a step S60 of peeling off the substrate.

7. An organic light emitting diode (OLED) display panel, comprising:
   a flexible material layer;
   a thin film transistor layer disposed on the flexible material layer;
   an organic light emitting layer disposed on the thin film transistor layer; and
   a wetting layer disposed on a side of the flexible material layer facing away from the organic light emitting layer;
   wherein the flexible material layer has a same film thickness at different positions.

8. The OLED display panel according to claim 7, wherein the wetting layer has a same film thickness at different positions.

9. The OLED display panel according to claim 7, wherein a material of the wetting layer is hydrophobic.

10. The OLED display panel according to claim 7, wherein a material of the wetting layer comprises amphiphilic surfactant comprising one or more of a quaternary ammonium salt, sodium laurylsulfonate, sodium dodecyl benzene sulfonate, polyvinyl alcohol, and polyvinyl chloride.

11. An organic light emitting diode (OLED) display panel, comprising:
    a flexible material layer;

a thin film transistor layer disposed on the flexible material layer;

an organic light emitting layer disposed on the thin film transistor layer; and a wetting layer disposed on a side of the flexible material layer facing away from the organic light emitting layer;

wherein a hydrophilicity of the wetting layer is same as a hydrophilicity of the flexible material layer, and the flexible material layer has a same film thickness at different positions.

12. The OLED display panel according to claim 11, wherein the wetting layer has a same film thickness at different positions.

13. The OLED display panel according to claim 11, wherein a material of the wetting layer is hydrophobic.

14. The OLED display panel according to claim 11, wherein the wetting layer is made by wetting layer material liquid having a mass concentration of 0.01% to 10%.

15. The OLED display panel according to claim 11, wherein a material of the wetting layer comprises amphiphilic surfactant comprising one or more of a quaternary ammonium salt, sodium laurylsulfonate, sodium dodecyl benzene sulfonate, polyvinyl alcohol, and polyvinyl chloride.

* * * * *